US011270428B2

(12) United States Patent
Fatih

(10) Patent No.: US 11,270,428 B2
(45) Date of Patent: Mar. 8, 2022

(54) METHODS AND SYSTEMS FOR SEMICONDUCTOR STRUCTURE THICKNESS MEASUREMENT

(71) Applicant: YANGTZE MEMORY TECHNOLOGIES CO., LTD., Wuhan (CN)

(72) Inventor: Olmez Fatih, Wuhan (CN)

(73) Assignee: YANGTZE MEMORY TECHNOLOGIES CO., LTD., Wuhan (CN)

(*) Notice: Subject to any disclaimer, the term of this patent is extended or adjusted under 35 U.S.C. 154(b) by 25 days.

(21) Appl. No.: 16/860,995

(22) Filed: Apr. 28, 2020

(65) Prior Publication Data
US 2021/0295496 A1 Sep. 23, 2021

Related U.S. Application Data

(63) Continuation of application No. PCT/CN2020/079570, filed on Mar. 17, 2020.

(51) Int. Cl.
*G06T 7/00* (2017.01)
*G06T 7/13* (2017.01)
(Continued)

(52) U.S. Cl.
CPC .......... *G06T 7/0006* (2013.01); *G01B 11/06* (2013.01); *G06T 7/13* (2017.01); *G06T 7/70* (2017.01); *G06T 2207/30148* (2013.01)

(58) Field of Classification Search
CPC .......... G06T 7/0006; G06T 7/13; G06T 7/70; G06T 2207/30148; G01B 11/06; G01B 2210/23; H01L 22/12
See application file for complete search history.

(56) References Cited

U.S. PATENT DOCUMENTS

2003/0218758 A1    11/2003   Shinya
2013/0149800 A1*   6/2013    Kiermasz ............... H01L 22/12
                                                                    438/14
(Continued)

FOREIGN PATENT DOCUMENTS

CN    103839250 A    6/2014
CN    106601642 A    4/2017
(Continued)

OTHER PUBLICATIONS

Kim, H. T., et al. "A Precise Inspection Technique for Wafer Pre-sawing Lines using Affine Transformation." 2008 15th International Conference on Mechatronics and Machine Vision in Practice. IEEE, 2008. (Year: 2008).*

*Primary Examiner* — Vu Le
*Assistant Examiner* — Tracy Mangialaschi
(74) *Attorney, Agent, or Firm* — Bayes PLLC

(57) ABSTRACT

Embodiments related to systems and methods for thickness measurement in semiconductor structures are disclosed. For example, a method for thickness detection in a semiconductor structure may include detecting, by at least one processor, a tilt of an image of a stack of layers in the semiconductor structure. The method may also include performing, by the at least one processor, rough boundary line detection on the layers of the stack in the image. The method may further include performing, by the at least one processor, fine thickness detection on the layers of the stack in the image. The rough boundary line detection may detect boundaries of the layers of the stack with a first precision and the fine thickness detection may detect thickness of the layers of the stack with a second precision greater than the first precision. The method may additionally include providing, by the at least one processor, output results of the fine thickness detection.

20 Claims, 11 Drawing Sheets

(51) Int. Cl.
*G06T 7/70* (2017.01)
*G01B 11/06* (2006.01)

(56) References Cited

U.S. PATENT DOCUMENTS

| | | | | |
|---|---|---|---|---|
| 2015/0300809 A1* | 10/2015 | Kononchuk | ............ | H01L 22/12 |
| | | | | 356/630 |
| 2017/0109896 A1* | 4/2017 | Park | ........................ | G06T 5/002 |
| 2018/0347966 A1* | 12/2018 | Kononchuk | ............ | H01L 22/12 |

FOREIGN PATENT DOCUMENTS

| | | | |
|---|---|---|---|
| CN | 107218894 A | | 9/2017 |
| CN | 107723657 A | * | 2/2018 |
| CN | 108981624 A | | 12/2018 |
| CN | 110231004 A | * | 9/2019 |
| JP | 2001201318 A | * | 7/2001 |
| JP | 2001201318 A | | 7/2001 |

* cited by examiner

METHODS AND SYSTEMS FOR SEMICONDUCTOR STRUCTURE THICKNESS MEASUREMENT

CROSS-REFERENCE TO RELATED APPLICATIONS

This application is continuation of International Application No. PCT/CN2020/079570, filed on Mar. 17, 2020, entitled "METHODS AND SYSTEMS FOR SEMICONDUCTOR STRUCTURE THICKNESS MEASUREMENT," which is hereby incorporated by reference in its entirety.

BACKGROUND

Embodiments of the present disclosure relate to metrology systems and methods in semiconductor manufacturing.

In general, control of process parameters is aided by the measurement of the parameters. In certain semiconductor fabrication processes, stacks of layers are created. The thickness of these layers is accordingly measured for a variety of purposes, such as quality control and process validation and optimization. The measurement is usually performed by inputting images taken at the cross-sections of the semiconductor devices into proprietary software and manually drawing and marking the structures on the images.

SUMMARY

Embodiments of thickness detection in a semiconductor structure are disclosed herein.

In an example, a method for thickness detection in a semiconductor structure may include detecting, by at least one processor, a tilt of an image of a stack of layers in the semiconductor structure. The method may also include performing, by the at least one processor, rough boundary line detection on the layers of the stack in the image. The method may further include performing, by the at least one processor, fine thickness detection on the layers of the stack in the image. The rough boundary line detection may detect boundaries of the layers of the stack with a first precision and the fine thickness detection may detect thickness of the layers of the stack with a second precision greater than the first precision. The method may additionally include providing, by the at least one processor, output results of the fine thickness detection.

In another example, a system for thickness detection in a semiconductor structure may include at least one processor and at least one memory storing computer program code. The at least one processor may be configured to, with the at least one memory and the computer program code, cause the system at least to detect a tilt of an image of a stack of layers in a semiconductor structure. The at least one processor may also be configured to cause the system at least to perform rough boundary line detection on the layers of the stack in the image. The at least one processor may further be configured to cause the system at least to perform fine thickness detection on the layers of the stack in the image. The rough boundary line detection may detect the boundaries of layers of the stack with a first precision and the fine thickness detection may detect thickness of the layers of the stack with a second precision greater than the first precision. The at least one processor may additionally be configured to cause the system at least to provide output results of the fine thickness detection.

In still another example, a non-transitory computer-readable medium may be encoded with instructions that, when executed in hardware, cause a device to perform a process for thickness detection in a semiconductor structure. The process may include detecting a tilt of an image of a stack of layers in the semiconductor structure. The process may also include performing rough boundary line detection on the layers of the stack in the image. The process may further include performing fine thickness detection on the layers of the stack in the image. The rough boundary line detection may detect boundaries of the layers of the stack with a first precision and the fine thickness detection may detect thickness of the layers of the stack with a second precision greater than the first precision. The process may additionally include providing output results of the fine thickness detection.

BRIEF DESCRIPTION OF THE DRAWINGS

The accompanying drawings, which are incorporated herein and form a part of the specification, illustrate embodiments of the present disclosure and, together with the description, further serve to explain the principles of the present disclosure and to enable a person skilled in the pertinent art to make and use the present disclosure.

Figure 1A:
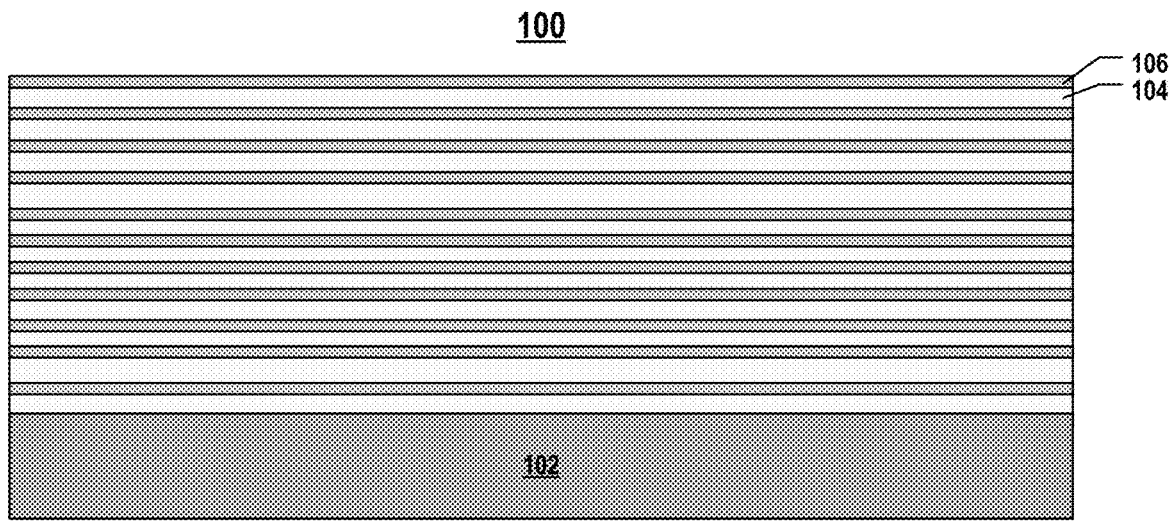
FIG. 1A illustrates a cross-section of an exemplary semiconductor structure having a stack of alternating silicon dioxide layers and silicon nitride layers.

Embodiments of the present disclosure will be described with reference to the accompanying drawings.

DETAILED DESCRIPTION

Although specific configurations and arrangements are discussed, it should be understood that this is done for illustrative purposes only. A person skilled in the pertinent art will recognize that other configurations and arrangements can be used without departing from the spirit and scope of the present disclosure. It will be apparent to a person skilled in the pertinent art that the present disclosure can also be employed in a variety of other applications.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment. Further, when a particular feature, structure or characteristic is described in connection with an embodiment, it would be within the knowledge of a person skilled in the pertinent art to affect such feature, structure or characteristic in connection with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain unpatterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which interconnect lines and/or vertical interconnect access (VIA) contacts are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

As used herein, the term "3D memory device" refers to a semiconductor device with vertically oriented strings of memory cell transistors (referred to herein as "memory strings," such as NAND memory strings) on a laterally-oriented substrate so that the memory strings extend in the vertical direction with respect to the substrate. As used herein, the term "vertical/vertically" means nominally perpendicular to the lateral surface of a substrate.

In semiconductor devices, such as 3D memory devices, stacks of layers have been used as intermediate structures during the fabrication process or structures in the final devices. FIG. 1A illustrates a cross-section of an exemplary semiconductor structure 100 having a stack of alternating silicon dioxide layers 104 and silicon nitride layers 106. Semiconductor structure 100 is an intermediate structure during the fabrication of a 3D NAND memory device. Semiconductor structure 100 includes a substrate 102, such as a silicon substrate, and a stack of alternating silicon dioxide layers 104 and silicon nitride layers 106 above substrate 102. Silicon dioxide layers 104 and silicon nitride layers 106 alternate in the vertical direction. In other words, except for the ones at the top or bottom of the stack, each silicon dioxide layer 104 is adjoined by two silicon nitride layers 106 on both sides, and each silicon nitride layer 106 is adjoined by two silicon dioxide layers 104 on both sides. Silicon dioxide layers 104 each have nominally the same thickness. Similarly, silicon nitride layers 106 each have nominally the same thickness. In other examples, silicon dioxide layers 104 may be replaced with silicon nitride layers, silicon oxynitride layers, or high dielectric-constant (k) dielectric layers, and silicon nitride layers 106 may be replaced with polysilicon layers, silicide layers, or metal layers. The stack of alternating silicon dioxide layers 104 and silicon nitride layers 106 is formed by alternatingly depositing silicon dioxide layers 104 and silicon nitride layers 106 above substrate 102 using one or more thin film deposition processes including, but not limited to, chemical vapor deposition (CVD), physical vapor deposition (PVD), atomic layer deposition (ALD), or any combination thereof.

Figure 1B:
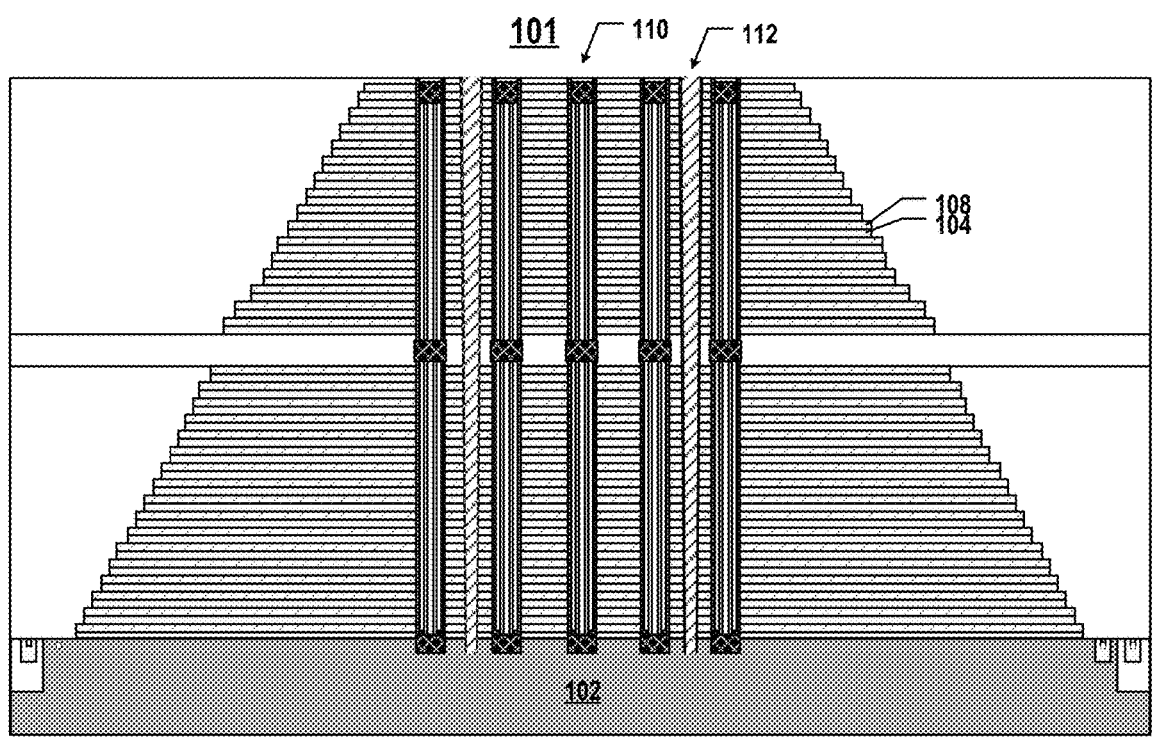
FIG. 1B illustrates a cross-section of an exemplary three-dimensional (3D) memory device having a stack of alternating silicon dioxide layers and metal layers.

FIG. 1B illustrates a cross-section of an exemplary 3D memory device 101 having a stack of alternating silicon dioxide layers 104 and metal layers 108. 3D memory device 101 is the final device after the completion of the fabrication process. 3D memory device 101 includes a stack of alternating silicon dioxide layers 104 and metal layers 108. Metal layers 108 include tungsten (W) layers or any other suitable metal layers, such as copper (Cu) layers, aluminum (Al) layers, cobalt (Co) layers, etc. Silicon dioxide layers 104 and metal layers 108 alternate in the vertical direction. In other words, except the ones at the top or bottom of the stack, each silicon dioxide layer 104 is adjoined by two metal layers 108 on both sides, and each metal layer 108 is adjoined by two silicon dioxide layers 104 on both sides. Silicon dioxide layers 104 each the nominally the same thickness. Similarly, metal layers 108 each have nominally the same thickness. The stack of alternating silicon dioxide layers 104 and metal layers 108 is formed from the stack of alternating silicon dioxide layers 104 and silicon nitride layers 106 in FIG. 1A by a so-called "gate replacement process," which replaces silicon nitride layers 106 with metal layers 108 using wet etching and metal deposition.

As shown in FIG. 1B, 3D memory device 101 also includes an array of channel structures 110 each extending vertically through the stack of alternating silicon dioxide layers 104 and metal layers 108, and a plurality of slit structures 112 each extending vertically through the stack of alternating silicon dioxide layers 104 and metal layers 108 as well as extending laterally to separate channel structures 110 into memory blocks. Slit structure 112, before being filled with dielectric materials, also serves as the passageway for transporting the wet etchant and deposition gases for the gate replacement process. In other examples, a stack of alternating silicon dioxide layers 104 and metal layers 108, as opposed to silicon nitride layers 106, is formed without the gate replacement process, e.g., by alternatingly depositing silicon dioxide layers 104 and metal layers 108 above substrate 102 directly. Regardless of the specific materials, stacks of alternating first material layers and second material layers different from the first material layers are widely used in the fabrication of 3D memory device, and any other semiconductor devices.

During or after the fabrication process, the thickness control of the stack of alternating first material layers and second material layers is important for quality control. For example, in the case of measuring alternating layers of silicon nitride and silicon dioxide, the known thin film thickness detection practice involved the following steps. First, the images were down-sampled in order to remove noise from images. Down-sampling, however, can cause image resolution reduction. This resolution reduction inherently causes error amounts to increase because the minimum error cannot be better than the image resolution. For example, if one pixel is equal to 0.1 nm in an image, the boundary detection of the alternating layer stack cannot have an error rate smaller than 0.1 nm. If such an image is down-sampled and one pixel becomes equal to 1 nm, then even though the resulting image may be less noisy and deemed more suitable for the thickness analysis, the thickness measurement result will not have an error rate smaller than 1 nm.

Second, in the known approach, the thickness is detected by choosing the clearest part of the image manually. This manual selection introduces subjectivity to the obtained data. Because selection is up to the individual preference of the technician and is not bound by rules if a transmission electron microscopy (TEM) image of an alternating layer stack is sent to be analyzed on one day and again on another day, the results from different days will not be identical. Additionally, in this known approach sometimes there may be as few as one data point for each alternating layer stack. For example, a sample size of 1 to determine the mean thickness is more likely to produce errors, and related parameters such as variance become impossible.

Figure 2:
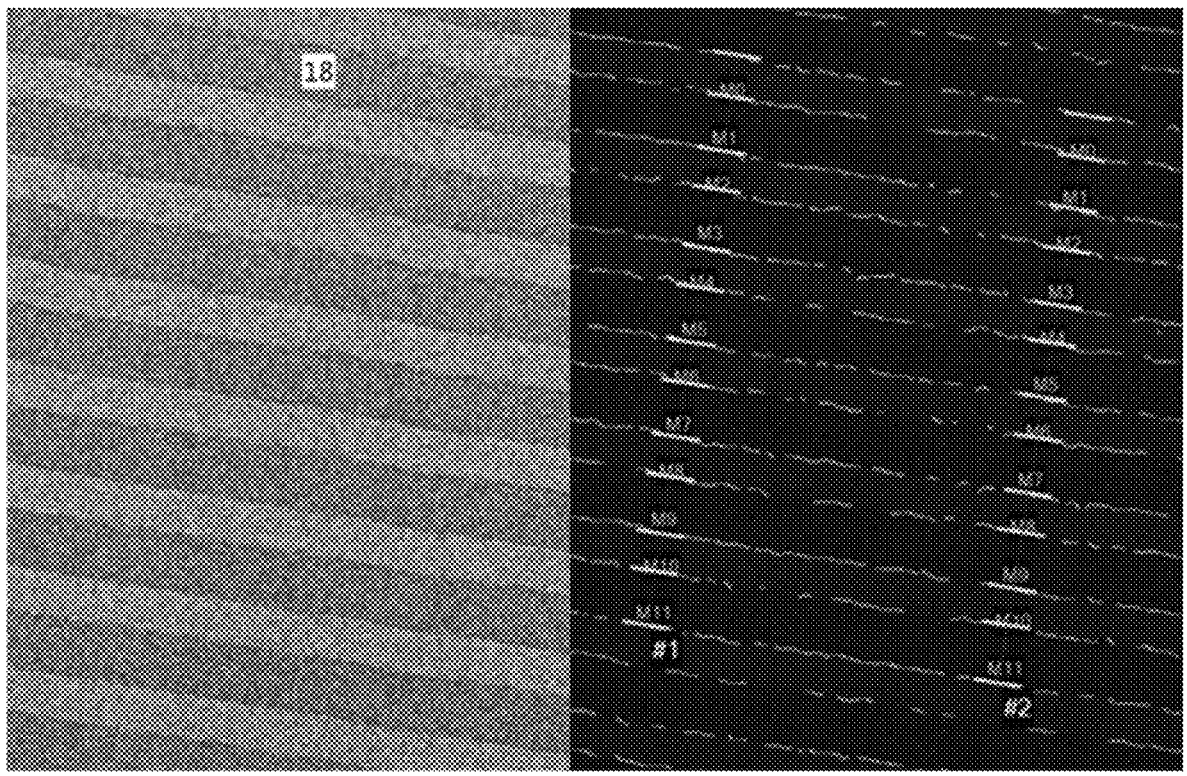
FIG. 2 illustrates an image showing alternating silicon dioxide layers and silicon nitride layers with manually marked boundary lines.

For example, FIG. 2 illustrates an image showing alternating silicon dioxide layers and silicon nitride layers with boundary lines for manual thickness marking. As shown in FIG. 2, an image labeled "18" on the left side of FIG. 2 is down-sampled from a TEM image taken at the cross-section of a stack of alternating silicon dioxide layers and silicon nitride layers. The down-sampled image is input into proprietary software to draw boundaries between the layers, resulting in boundaries labeled "M0," "M1," "M2," ..., and "M11" being detected at two columns "#1" and "#2" on the right side of FIG. 2. A user can then manually mark the thickness where the boundary is deemed clear enough. The thickness measurement method, however, has various shortcomings as described above, such as high error rate, inconsistency, and low sample size.

Certain embodiments of the present disclosure avoid the above-identified issues and provide various benefits and/or advantages. For example, certain embodiments may avoid the need for down-sampling and may permit numerous samples to be analyzed. Certain embodiments may work from a raw image, such as a TEM image, a scanning electron microscopy (SEM) image, or a scanning transmission electron microscopy (STEM) image. Thus, error may be reduced, such as at the range of 1-3 angstroms instead of 10-20 angstroms, where raw TEM images have a resolution near the 1-3 angstrom range. Certain embodiments may reliably produce the same results on the same images, regardless of the user variations. Additionally, the number of usable data points may be increased by an order of magnitude, providing a higher degree of confidence in the measurement results.

Figure 3:
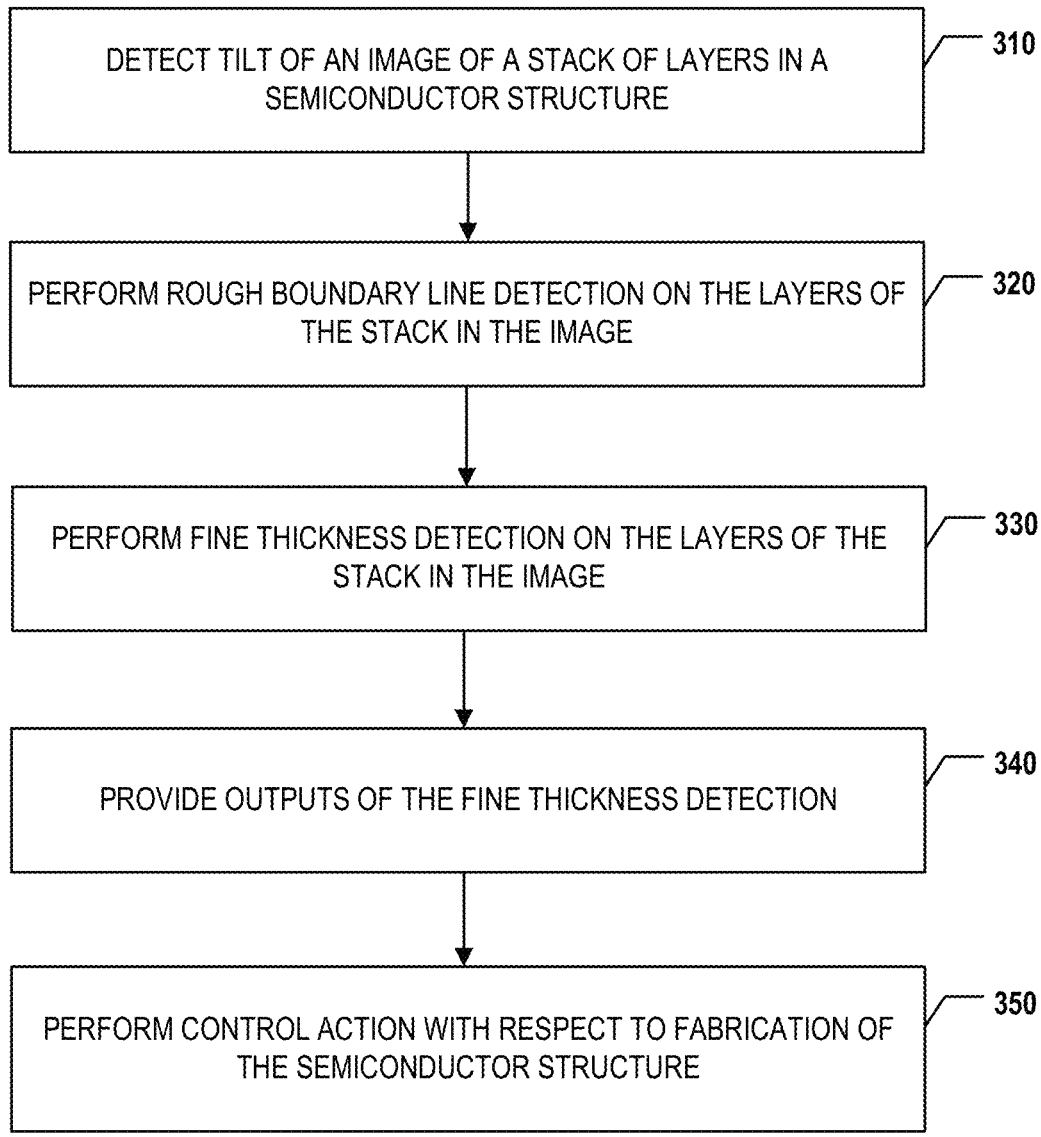
FIG. 3 illustrates a flowchart of an exemplary method for thickness measurements in a semiconductor structure, according to certain embodiments of the present disclosure.

FIG. 3 illustrates a flowchart of an exemplary method 300 for thickness measurements in a semiconductor structure, according to certain embodiments of the present disclosure. It is understood that the operations shown in method 300 are not exhaustive and that other operations can be performed as well before, after, or between any of the illustrated operations. Further, some of the operations may be performed simultaneously, or in a different order than shown in FIG. 3.

As shown in FIG. 3, method 300 can include detecting a tilt of an image of a stack of layers in a semiconductor structure at operation 310. The image can be a greyscale image or can be converted into a greyscale image, such that the relative intensities of various pixels of the image can be compared to one another. The stack can include alternating layers of a first material and a second material different from the first material. In one example, the first and second materials may include silicon dioxide and silicon nitride, respectively. In another example, the first and second materials may include silicon dioxide and a metal, respectively. In still another example, the first and second materials may include silicon dioxide and polysilicon, respectively. The alternating layers can be any suitable part of a semiconductor device, such as a 3D memory device, either as an intermediate structure during the fabrication or in the final device after the fabrication. The alternating layers can be lateral layers stacked in a vertical direction. In certain cases, the image may show the layers extending at some offset from purely horizontally. For example, the layers may be tilted at about 5% or more from the horizontal. The images may be taken using SEM, TEM, STEM, or other similar techniques for imaging at a nanometer or sub-micron scale.

The detection of the tilt may be performed by identifying a tilt that minimizes a cost function with respect to intensity variation for representative lines across the image in a lateral direction. For example, in an ideal image, the layers are all purely horizontal and are well-defined. In this case, every horizontal line of pixels has an identical intensity. If this was otherwise, for example, an ideal image was slightly rotated, such that a 5% tilt was introduced, the same horizontal lines would now experience significant changes in intensity. If the most severe possible tilt was encountered, namely a 90-degree tilt, the number of those severe intensity changes would be at a maximum. There are multiple ways to determine the tilt of the image, but one way is to identify a tilt that minimizes a cost function with respect to intensity variation for a number of sample parallel lines. In a real image, unlike the ideal image, even within the center of a layer, there may be pixel intensity variation. Thus, even if a real image has zero tilt, a representative line will experience a degree of intensity variation. Moreover, if the representative line happens to fall along a boundary between the layers, this intensity variation may be even more pronounced.

Other methods of tilt detection are also permitted. For example, a tilt can be determined that minimizes the period of smoothed intensity variation in the vertical direction. This approach may be viewed as an orthogonal approach to minimizing intensity variation in the horizontal direction. It is understood that if the image is too cloudy or dark, tilt detection may not be possible. In such a case, the image may be discarded and processing on the image be discontinued.

Figure 4:
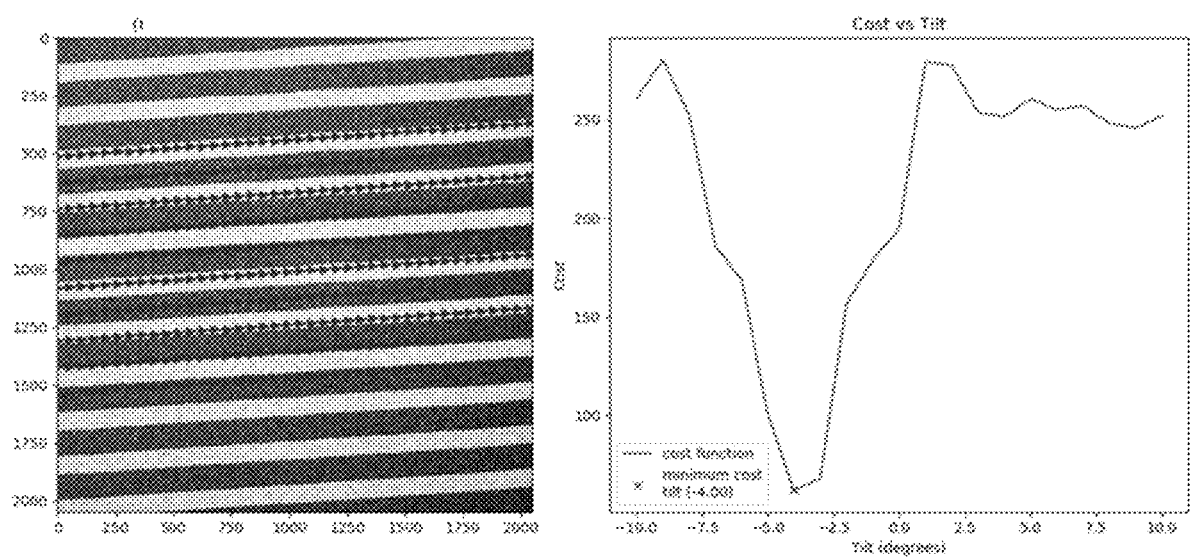
FIG. 4 illustrates an exemplary process of rough image tilt detection using a cost function, according to certain embodiments of the present disclosure.

As one example of operation 310 in method 300, FIG. 4 illustrates an exemplary process of rough image tilt detection using a cost function, according to certain embodiments of the present disclosure. Other techniques for performing tilt detection are also permitted, with this approach being one example. As shown on the left side of FIG. 4, a raw TEM image without down-sampling may be taken at the cross-section of a stack of alternating silicon dioxide layers and silicon nitride layers. Representative lines (represented as a series of arrows in FIG. 4), which do not need to be boundaries, can be automatically identified, and a tilt can be automatically found that minimizes a cost function to normalize the lines. The source of this tilt may be alignment between the TEM imaging device taking the TEM image and the sample having the stack of alternating silicon dioxide layers and silicon nitride layers. It is understood that TEM is an exemplary imaging device and other imaging devices are also possible, such as SEM or STEM. If desired, the tilt value may be provided back to a TEM or other imaging device to provide feedback for control of the TEM or other imaging devices. It is also understood that the stack of alternating silicon dioxide layers and silicon nitride layers is an exemplary semiconductor structure and other stacks of alternating first material layers and second material layers different from the first material layers are also possible, such as a stack of alternating silicon dioxide layers and metal layers or a stack of alternating silicon dioxide layers and polysilicon layers.

In certain embodiments, there are typically no TEM images that come with an image tilt that ranges between about −10 degrees and about 10 degrees. A cost function can be used to detect the image tilt within about 1-degree accuracy or so. The cost function for a given tilt can involve summing up the intensity non-uniformities from left-to-right on the TEM images. Multiple representative lines may be used, as lines that happen fall right at layer boundaries may create issues. An exemplary cost function is illustrated on the right side of FIG. 4, which shows the relationship between cost and the tilt, with a minimum cost at the tilt of about −4 degrees. The representative lines on the left side of FIG. 4 have a tilt of about −4 degrees corresponding to the minimum cost in the cost function on the right side. The cost may be evaluated in a variety of ways, such as by determining a standard deviation of the intensity values along representative lines at a given tilt. Thus, for example, at larger values of tilt, the standard deviation in intensity may be about 250 units of intensity, whereas the standard deviation in intensity at about 4 degrees tilt may be around 20 units of intensity. In this instance, only a tilt range of +/−10 degrees was evaluated. In certain embodiments, there is no need to rotate the image itself. Instead, the identified tilt value can be taken into account in later steps of a process of thickness determination.

Referring again to FIG. 3, method 300 can also include, at operation 320, performing rough boundary line detection on the layers of the stack in the image. The rough boundary line detection can be performed in a variety of ways. For example, performing the rough boundary line detection can include determining mid-points in average intensity in a vertical direction in the image. This approach may be performed without directly taking into account the tilt. For example, if the tilt is within than a threshold, such as +/−45 degrees, the rough boundary line detection can be performed on the original image. Otherwise, if the tilt is between 45 and 90 degrees, the image can be rotated 90 degrees before performing the rough boundary line detection. As another alternative, the image may be rotated by the detected tilt amount prior to performing the rough boundary line detection.

When determining the midpoints, a quadratic fit may be performed on the average intensities measured in the vertical direction. Multiple vertical samples can be taken, and the rough boundary lines can be formed based on fitting lines to the samples. Alternatively, the entire image can be scanned, and the rough boundary lines can be the approximately adjacent points identified by the quadratic fit.

If the entire image is scanned, a degree of linearity of the rough boundary lines generated from the quadratic fit may be determined. A linear fit may be performed after initial points for the rough boundary lines are determined. The linear fit may be compared to the determined tilt. If the linear fit is more than a threshold amount different from the determined tilt, the image may be discarded. In another alternative, points, where the rough boundary line determined via the quadratic fit is more than a threshold amount from the linear fit, may be excluded from further consideration.

Figure 5:
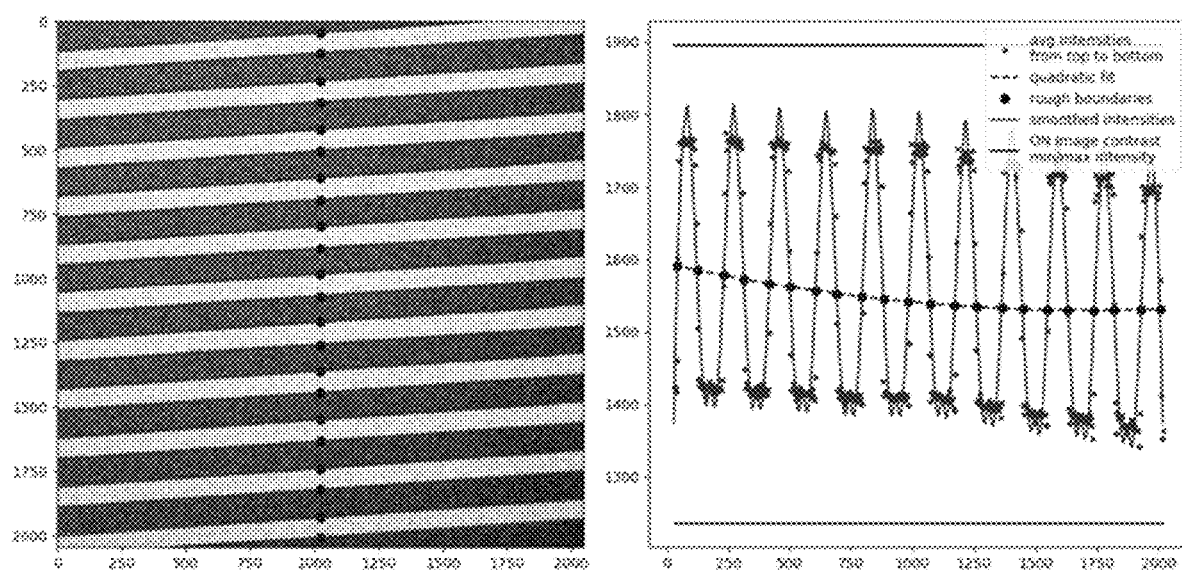
FIG. 5 illustrates an exemplary process of rough boundary line detection, according to certain embodiments of the present disclosure.

As one example of operation 320 in method 300, FIG. 5 illustrates an exemplary process of rough boundary line detection, according to certain embodiments of the present disclosure. As shown in FIG. 5 at left, rough boundary lines (represented by the dark dots) may be automatically found at each boundary layer between a silicon dioxide layer and a silicon nitride layer in the stack on the TEM image. In certain embodiments, the rough boundary lines are automatically identified by calculating the average image intensity along the image tilt direction (e.g., from left to right or vice versa) as determined by the previous image tilt detection process and locating the sharp intensity changes. As shown on the right side of FIG. 5, one approach that can be used to automatically identify the rough boundary lines is to measure the average intensity of pixels in the vertical direction (i.e., from top to bottom or vice versa), quadratic fit the data, and then identify rough boundaries where the quadratic fit crosses a smoothed plot of the average intensities. There is no need to identify the rough boundary lines on a pixel by pixel basis. Instead, based on the previously determined tilt, the average image intensity of a tilted left-to-right line can be determined for each tilted line of the image. Then sharp intensity changes can be located by comparing the average intensities of the tilted lines to one another.

In FIG. 5, the units of the left side image's axes may be pixels (from the left and from the top, respectively). The right-side image's x-axis may be the same as the y-axis of the left-side image (i.e., pixels from the top), and the right-side image's y-axis may be an intensity value. The rough boundaries (represented by the dark dots) calculated by the approach on the right side of FIG. 5 may correspond to the rough boundary lines (represented by the dark dots) labeled on the TEM image at left. Other approaches for rough boundary determination are also permitted. The rough boundary lines are not used to calculate the thickness therebetween, but rather to initiate the fine thickness detection in the following process.

Referring again to FIG. 3, method 300 can further include, at operation 330, performing fine thickness detection on the layers of the stack in the image. Fine thickness detection may not need to be performed in every possible place in the image. Instead, fine thickness detection can be limited to samples where measurement is most reliable. Thus, for example, at places where a putative boundary is significantly different from the putative boundary of its nearest neighbors, the samples may be discarded.

Performing fine thickness detection can include detecting an intensity separator near a given rough boundary line detected by the rough boundary line detection. The intensity separator may initially be picked as a value corresponding to an intensity of a smoothed plot of the intensity data crossing the rough boundary line. The average intensity to each side of the first picked value can be determined. Then, a new value for boundary can be picked as corresponding to a midpoint between the two intensities. Thus, for example, if the average intensity on one side is 1,800 and the average intensity on the other side is 1,400, then the new boundary could be picked at the place where the smoothed input data crosses 1,600.

Performing fine thickness detection can further include validating the intensity separator. The validation can be performed by determining how well the intensity separator separates the intensity data points. Thus, the validating can include determining a degree to which the intensity separator separates pixels of different intensities. For example, in some cases, an intensity separator may separate nearly all the pixels above the mid-point intensity to one side, and nearly all the pixels below the mid-point intensity to another side. The minority of pixels on the wrong side of the intensity separator may be small in a good sample. If more than a predetermined threshold of pixels is on the wrong side of the intensity separator, then the sample may be discarded. If fewer than the predetermined threshold is on the wrong side, then the sample may be used.

In certain embodiments, in order to take a fine thickness measurement, two vertically consecutive boundary lines need to be acceptable. Once two vertically consecutive boundary lines are accepted, the distance between those two boundaries can be identified as the layer thickness for a sample of the layer bounded by the two vertically consecutive boundary lines.

Figure 6A:
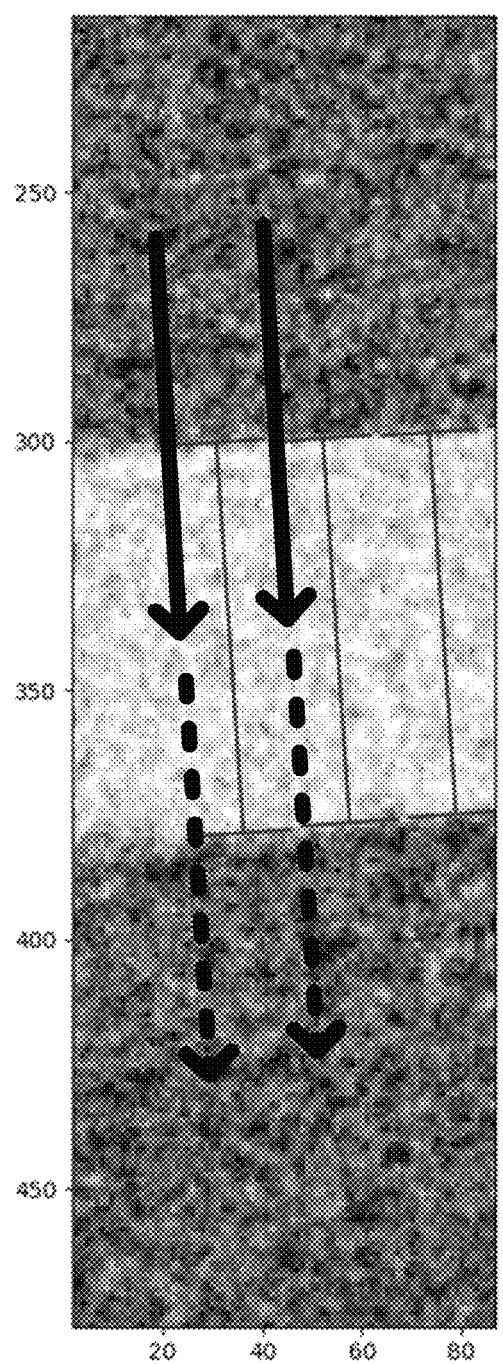
FIG. 6A illustrates a pair of boundaries of a stack of layers in an image, according to certain embodiments of the present disclosure.

Fine thickness detection after the rough boundary line detection may include detecting an intensity separator near each rough boundary and determining the quality of the intensity separator as illustrated by the following examples. As one example of operation 330 in method 300, FIG. 6A illustrates a pair of boundaries in a stack of layers in an image, according to certain embodiments of the present disclosure. As shown in FIG. 6A, the pixels in a top layer may have relatively low average intensity, pixels in the middle layer may have relatively high average intensity, and pixels in a bottom layer may have relatively low average intensity.

Figure 6B:
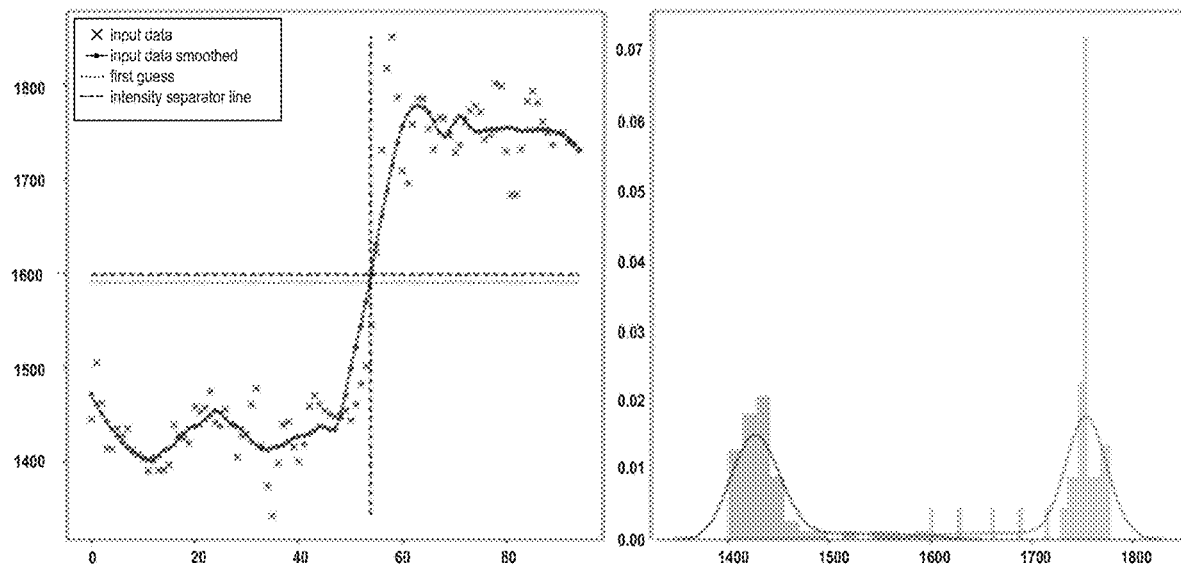
FIG. 6B illustrates an exemplary process of intensity separator determination, according to certain embodiments of the present disclosure.
Figure 6C:
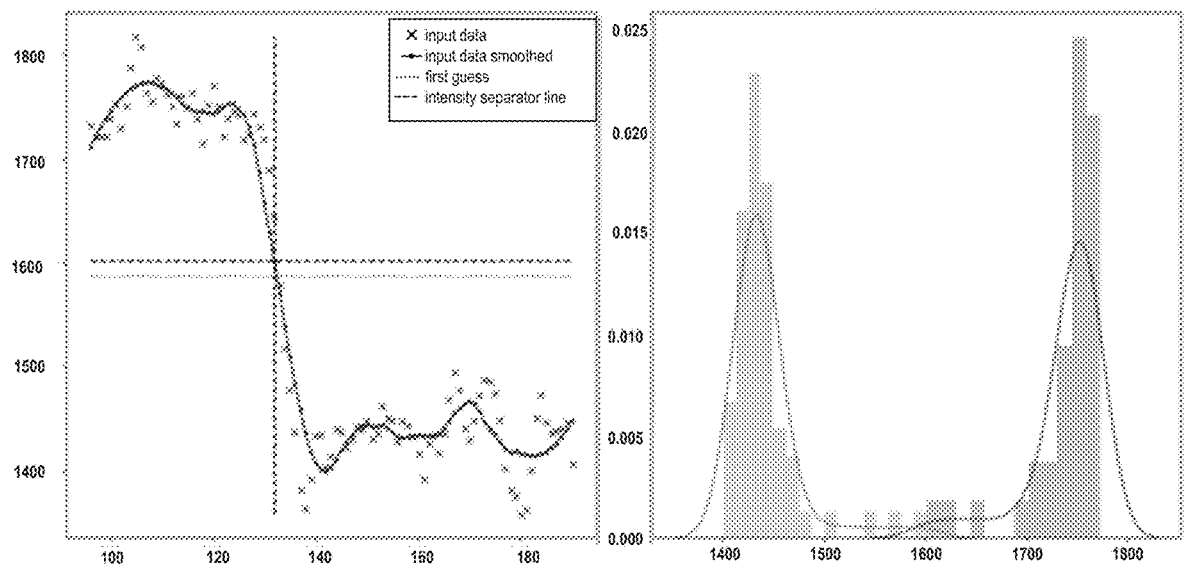
FIG. 6C illustrates another exemplary process of intensity separator determination, according to certain embodiments of the present disclosure.

FIG. 6B illustrates an exemplary process of intensity separator determination, according to certain embodiments of the present disclosure. FIG. 6B may correspond to crossing the boundary shown with a solid arrow in FIG. 6A. FIG. 6C illustrates another exemplary process of intensity separator determination, according to certain embodiments of the present disclosure. FIG. 6C may correspond to crossing the boundary shown with a broken arrow in FIG. 6A. As shown in FIGS. 6B and 6C, input intensity data may be clustered at two different intensity levels, corresponding to the silicon dioxide average intensity and silicon nitride average intensity. FIG. 6B illustrates a transition from the low-intensity material to the high-intensity material, while FIG. 6C illustrates a transition from the high-intensity material to the low-intensity material.

A first guess separator line may be obtained by selecting a mid-point between silicon dioxide average intensity and silicon nitride average intensity. As shown in FIG. 6A, the intensity separator line in this case provides an intensity separation ratio of about 97.56%, while in FIG. 6B, the intensity separator line in that case provides an intensity separation ratio of about 97.3%. That means that less than 3% of the pixels have intensities that appear to be on the wrong side of the line in each case. This analysis may be performed with respect to a window of pixels around a rough boundary segment. The analysis may be repeatedly performed on multiple windows along with segments of the same rough boundary line and each of the other boundary lines.

Figure 7A:
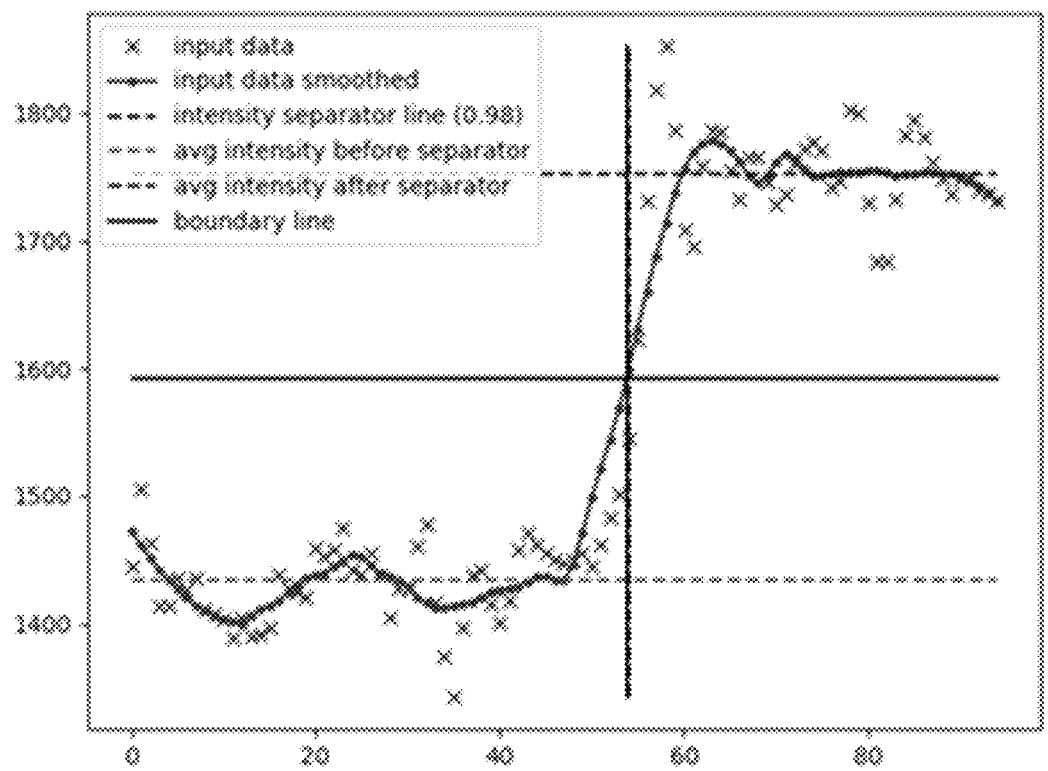
FIG. 7A illustrates further detail of the example shown in FIG. 6B, according to certain embodiments of the present disclosure.
Figure 7B:
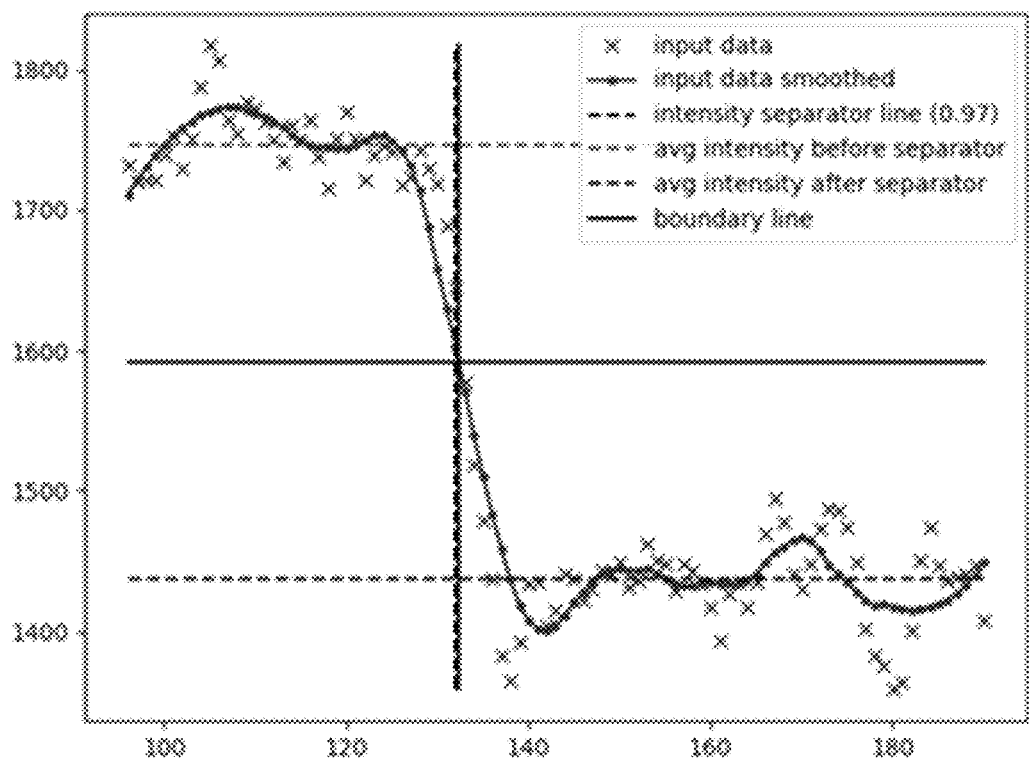
FIG. 7B illustrates further detail of the example shown in FIG. 6C, according to certain embodiments of the present disclosure.

FIGS. 7A and 7B illustrate further detail of the examples shown in FIGS. 6B and 6C, respectively. As shown in FIGS. 7A and 7B, two average intensities (illustrated by dashed lines) can be determined: in FIG. 7A the lower average corresponds to the pixels before the separator and the upper average corresponds to the pixels after the separator, whereas in FIG. 7B the upper average corresponds to the pixels before the separator and the lower average corresponds to the pixels after the separator. The difference between these two average intensities is large in both of these examples.

Referring again to FIG. 3, method 300 can additionally include, at operation 340, providing output results of the fine thickness detection. The outputs may be visual and/or computer-readable. For example, the output results can include a visual display presented on a graphic user interface. In a specific example, each validated pair of boundary lines can be displayed with a connector, and thickness values can be displayed corresponding to thereto. Additionally, statistics can be provided, such as the average thickness, variance of thickness, and the like. Statistics can also be provided as to historical measurements. Thus, the thicknesses of the layers in this image can be compared to thicknesses determined in previous measurements. Alarms or alerts may be provided when a statistical outlier is detected. For example, if the average thickness of layers in this sample is more than three standard deviations from historical values, the display may provide a highly noticeable indicator, such as a pop-up window blocking most of the screen.

Figure 8:
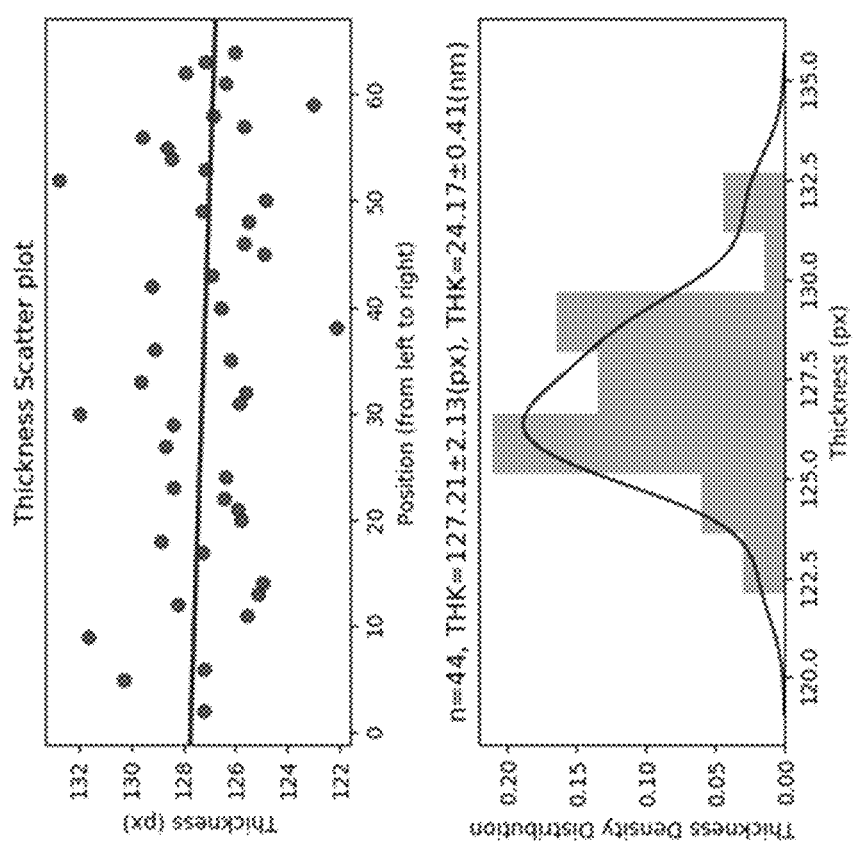
FIG. 8 illustrates an exemplary output of thickness measurements for a given layer, according to certain embodiments of the present disclosure.
Figure 8:
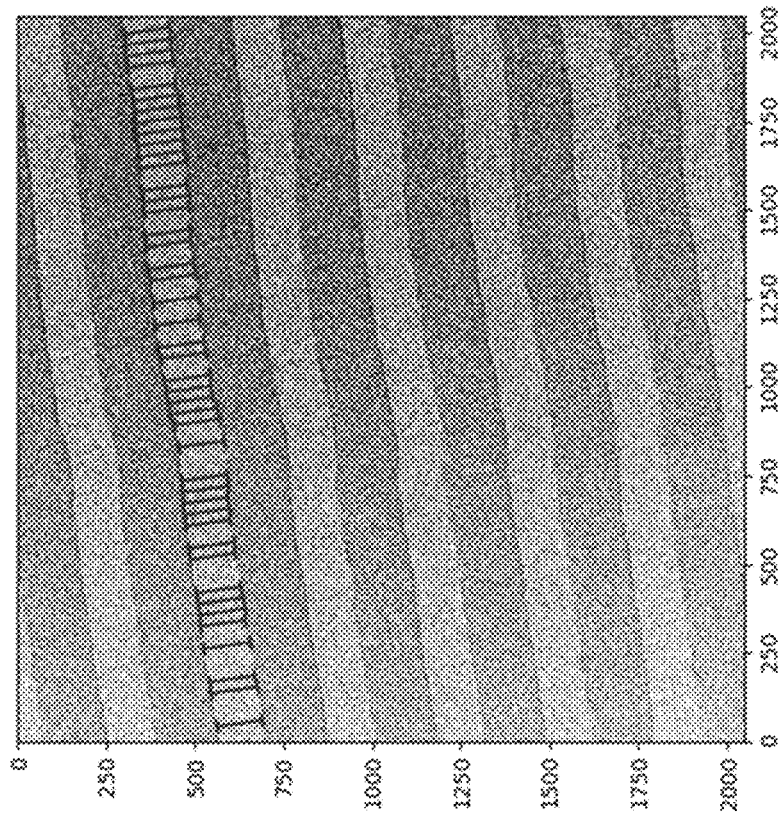

As one example of operation 340 in method 300, FIG. 8 illustrates an exemplary output of thickness measurements for a given layer, according to certain embodiments of the present disclosure. As shown in FIG. 8, on the left side, the raw TEM image of the layers may be provided with thickness measurements at usable samples overlaid. A thickness scatter plot may be provided on the upper right side of the display, together with a trend line of thickness values. The seemingly large difference in values may be due to the fact that the minimum of the chart is not zero. Finally, the lower right side of the display may illustrate the thickness density distribution with a smoothed line providing a visualization of how similar the thickness measurements are to one another. These visual outputs may be useful to a human technician, engineer, or other users. The same data may be provided to another computing device or software module to take a control action. For example, with apparently good results as shown, a control output to accept the currently produced materials and maintain manufacturing configurations may be decided. Alternatively, if the thickness density distribution were considered to have too high a variance, for example, the control action may be to reject currently produced materials (in whole or in part), to take a modification action regarding the manufacturing process, and/or to alert a human user to a possible fault condition.

Referring again to FIG. 3, in certain embodiments, at operation 350, method 300 can also include performing a control action with respect to fabrication of the semiconductor structure based on the output results. In this case, the output results may be computer-readable feedback, such as a bitstream or packets of data provided to a controller. The controller may be remote to the system performing the thickness analysis. The control action can include any of the following: maintaining production or fabrication of the semiconductor structure with existing settings, changing the setting for the production or fabrication of the semiconductor structure, discarding the semiconductor structure, or the like. Other control actions are also permitted. For example, in certain cases an analysis of the thickness may suggest that cleaning a deposition chamber is needed. Accordingly, production or fabrication in that chamber may be temporarily halted, cleaning may be performed, and then production or fabrication may be resumed.

Figure 9:
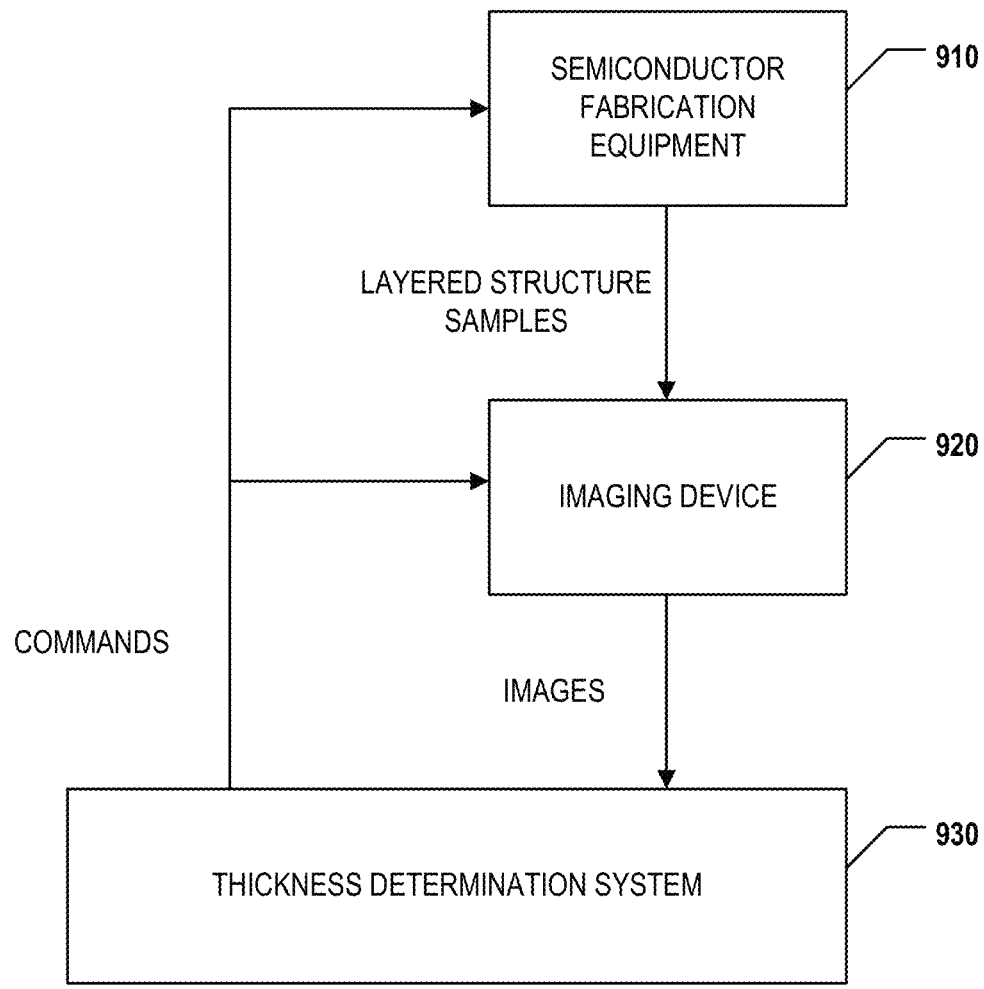
FIG. 9 illustrates an exemplary system for thickness measurements in a semiconductor structure, according to certain embodiments of the present disclosure.

FIG. 9 illustrates an exemplary system 900 for thickness measurements in a semiconductor structure, according to certain embodiments of the present disclosure. As shown in FIG. 9, system 900 may include semiconductor fabrication equipment 910. Semiconductor fabrication equipment 910 can include one or many deposition chambers configured to deposit alternating layers, such as alternating layers of a first material and a second material different from the first material, for example, silicon dioxide and silicon nitride. Semiconductor fabrication equipment 910 may include one or more deposition chambers for CVD, PVD, or ALD. Samples of these layered structures may be provided to an imaging device 920 of system 900. Imaging device 920 may be an SEM, a TEM, a STEM, or other imaging device configured to image features having a sub-micron, nanometer, or smaller scale. In other embodiments, the imaging device may be configured to image features having a larger scale, such as on the order of microns.

Images from imaging device 920 may be provided to a thickness determination system 930 including at least one processor and at least one memory storing computer program code. The at least one processor may be configured to, with the at least one memory and the computer program code, cause thickness determination system 930 to perform the thickness determination methods disclosed in the present disclosure, such as method 300 in FIG. 3.

Figure 10:
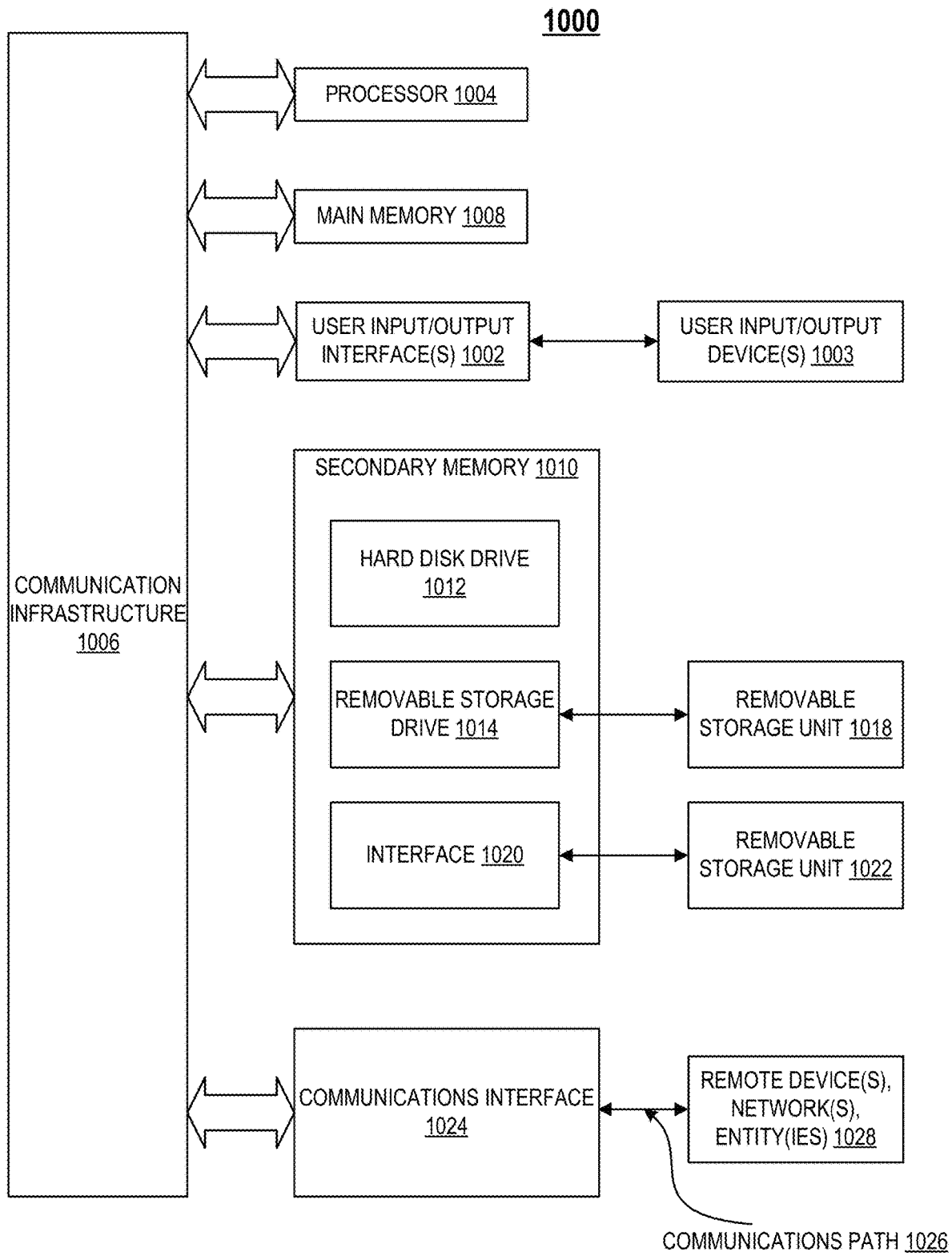
FIG. 10 illustrates a block diagram of an exemplary computing device, according to certain embodiments of the present disclosure.

Various embodiments can be implemented, for example, using one or more computing devices, such as a computing device 1000 shown in FIG. 10. One or more computing devices 1000 can be an example of thickness determination system 930 in FIG. 9 and can be used, for example, to implement method 300 of FIG. 3. For example, computing device 1000 can perform various functions in thickness determination described herein, such as rough image tilt detection, rough boundary line detection, fine thickness detection, and outputting. Computing device 1000 can be any computer capable of performing the functions described herein.

Computing device 1000 can include one or more processors (also called central processing units, or CPUs), such as a processor 1004. Processor 1004 is connected to a communication infrastructure or bus 1006, according to some embodiments. One or more processors 1004 can each be a graphics processing unit (GPU). In some embodiments, a GPU is a processor that is a specialized electronic circuit designed to process mathematically intensive applications. The GPU may have a parallel structure that is efficient for parallel processing of large blocks of data, such as mathematically intensive data common to computer graphics applications, images, videos, etc. Computing device 1000 can also include user input/output device(s) 1003, such as monitors, keyboards, pointing devices, etc., which communicate with communication infrastructure or bus 1006 through user input/output interface(s) 1002.

As shown in FIG. 10, computing device 1000 can also include a main or primary memory 1008, such as random-access memory (RAM). Main memory 1008 can include one or more levels of cache. Main memory 1008 has stored therein control logic (i.e., computer software) and/or data, according to some embodiments. As shown in FIG. 10, computing device 1000 can also include one or more secondary storage devices or memory 1010. Secondary memory 1010 can include, for example, a hard disk drive 1012 and/or a removable storage device or drive 1014. Removable storage drive 1014 can be a floppy disk drive, a magnetic tape drive, a compact disk drive, an optical storage device, tape backup device, and/or any other storage device/drive.

As shown in FIG. 10, removable storage drive 1014 can interact with a removable storage unit 1018. Removable storage unit 1018 includes a computer usable or readable storage device having stored thereon computer software (control logic) and/or data, according to some embodiments. Removable storage unit 1018 can be a floppy disk, magnetic tape, compact disk, DVD, optical storage disk, and/any other computer data storage device. Removable storage drive 1014 can read from and/or writes to removable storage unit 1018 in a well-known manner.

According to some embodiments, secondary memory 1010 can include other means, instrumentalities or other approaches for allowing computer programs and/or other instructions and/or data to be accessed by computing device 1000. Such means, instrumentalities or other approaches may include, for example, a removable storage unit 1022 and an interface 1020. Examples of removable storage unit 1022 and interface 1020 can include a program cartridge and cartridge interface (such as that found in video game devices), a removable memory chip (such as an EPROM or PROM) and associated socket, a memory stick and USB port, a memory card and associated memory card slot, and/or any other removable storage unit and associated interface.

Computing device 1000 can further include a communication or network interface 1024. Communication interface 1024 enables computing device 1000 to communicate and interact with any combination of remote devices, remote networks, remote entities, etc. (individually and collectively referenced by reference number 1028), according to some embodiments. For example, communication interface 1024 may allow computing device 1000 to communicate with remote devices 1028 over communications path 1026, which may be wired and/or wireless, and which may include any combination of LANs, WANs, the Internet, etc. Control logic and/or data may be transmitted to and from computing device 1000 via communication path 1026.

In some embodiments, a tangible apparatus or article of manufacture comprising a tangible computer useable or readable medium having control logic (software) stored thereon is also referred to herein as a computer program product or program storage device. This includes, but is not limited to, computing device 1000, main memory 1008, secondary memory 1010, and removable storage units 1018 and 1022, as well as tangible articles of manufacture embodying any combination of the foregoing. Such control logic, when executed by one or more data processing devices (such as computing device 1000), causes such data processing devices to operate as described herein.

Based on the teachings contained in this disclosure, it will be apparent to persons skilled in the relevant art(s) how to make and use embodiments of the present disclosure using data processing devices, computer systems and/or computer architectures other than that shown in FIG. 10. In particular, embodiments may operate with software, hardware, and/or operating system implementations other than those described herein.

According to one aspect of the present disclosure, a method for thickness detection in a semiconductor structure may include detecting, by at least one processor, a tilt of an image of a stack of layers in a semiconductor structure. The method may also include performing, by the at least one processor, rough boundary line detection on the layers of the stack in the image. The method may further include performing, by the at least one processor, fine thickness detection on the layers of the stack in the image. The rough boundary line detection may detect boundaries of the layers of the stack with a first precision and the fine thickness detection may detect thickness of the layers of the stack with a second precision greater than the first precision. The method may additionally include providing, by the at least one processor, output results of the fine thickness detection.

In some embodiments, the image includes a greyscale image.

In some embodiments, the stack includes alternating layers of a first material and a second material different from the first material.

In some embodiments, the alternating layers are lateral layers stacked in a vertical direction.

In some embodiments, the semiconductor structure is part of a 3D memory device.

In some embodiments, the detecting the tilt includes identifying a tilt that minimizes a cost function with respect to intensity variation for representative lines across the image in a lateral direction.

In some embodiments, the performing the rough boundary line detection includes determining mid-points in average intensity in a vertical direction.

In some embodiments, the determining midpoints include performing a quadratic fit on the average intensities.

In some embodiments, the performing fine thickness detection includes detecting an intensity separator near a given rough boundary line detected by the rough boundary line detection.

In some embodiments, the performing fine thickness detection further includes validating the intensity separator.

In some embodiments, the validating includes determining a degree to which the intensity separator separates pixels of different intensities.

In some embodiments, the output results include a visual display presented on a graphic user interface.

In some embodiments, the method may further include performing, by the at least one processor, a control action with respect to fabrication of the semiconductor structure based on the output results. The output results may include computer-readable feedback.

In some embodiments, the control action may include at least one of maintaining fabrication of the semiconductor structure with existing settings, changing a setting for the fabrication of the semiconductor structure, and discarding the semiconductor structure.

According to another aspect of the present disclosure, a system for thickness detection in a semiconductor structure may include at least one processor and at least one memory storing computer program code. The at least one processor may be configured to, with the at least one memory and the computer program code, cause the system at least to detect a tilt of an image of a stack of layers in a semiconductor structure, perform rough boundary line detection on the layers of the stack in the image, perform fine thickness detection on the layers of the stack in the image, and provide output results of the fine thickness detection. The rough boundary line detection may detect boundaries of the layers of the stack with a first precision and the fine thickness detection may detect thickness of the layers of the stack with a second precision greater than the first precision.

In some embodiments, the image may include a greyscale image.

In some embodiments, the stack may include alternating layers of a first material and a second material different from the first material.

In some embodiments, the alternating layers may be lateral layers stacked in a vertical direction.

In some embodiments, the semiconductor structure may be part of a 3D memory device.

In some embodiments, the at least one processor is configured to cause the system at least to detect the tilt by identifying a tilt that minimizes a cost function with respect to intensity variation for representative lines across the image in a lateral direction.

In some embodiments, the at least one processor is configured to cause the system at least to perform the rough boundary line detection by determining mid-points in average intensity in a vertical direction.

In some embodiments, the at least one processor is configured to cause the system at least to determine the midpoints by performing a quadratic fit on the average intensities.

In some embodiments, the at least one processor is configured to cause the system at least to perform fine thickness detection by detecting an intensity separator near a given rough boundary line detected by the rough boundary line detection.

In some embodiments, the at least one processor is configured to cause the system at least to validate the intensity separator.

In some embodiments, the at least one processor is configured to cause the system at least to validate the intensity separator by determining a degree to which the intensity separator separates pixels of different intensities.

In some embodiments, the output results may include a visual display presented on a graphic user interface.

In some embodiments, the at least one processor is configured to cause the system at least to perform a control action with respect to fabrication of the semiconductor structure based on the output results. The output results may include computer-readable feedback.

In some embodiments, the control action may include at least one of maintaining fabrication of the semiconductor structure with existing settings, changing a setting for the fabrication of the semiconductor structure, and discarding the semiconductor structure.

According to still another aspect of the present disclosure, a non-transitory computer-readable medium can be encoded with instructions that, when executed in hardware, cause a device to perform a process for thickness detection in a semiconductor structure. The process can include detecting a tilt of an image of a stack of layers in the semiconductor structure. The process can also include performing rough boundary line detection on the layers of the stack in the image. The process can further include performing fine thickness detection on the layers of the stack in the image. The rough boundary line detection may detect boundaries of the layers of the stack with a first precision and the fine thickness detection may detect thickness of the layers of the stack with a second precision greater than the first precision. The process can additionally include providing output results of the fine thickness detection.

In some embodiments, the image includes a greyscale image.

In some embodiments, the stack includes alternating layers of a first material and a second material different from the first material.

In some embodiments, the alternating layers are lateral layers stacked in a vertical direction.

In some embodiments, the semiconductor structure is part of a 3D memory device.

In some embodiments, the detecting the tilt includes identifying a tilt that minimizes a cost function with respect to intensity variation for representative lines across the image in a lateral direction.

In some embodiments, the performing the rough boundary line detection includes determining mid-points in average intensity in a vertical direction.

In some embodiments, the determining midpoints include performing a quadratic fit on the average intensities.

In some embodiments, the performing fine thickness detection includes detecting an intensity separator near a given rough boundary line detected by the rough boundary line detection.

In some embodiments, the performing fine thickness detection further includes validating the intensity separator.

In some embodiments, the validating includes determining a degree to which the intensity separator separates pixels of different intensities.

In some embodiments, the output results include a visual display presented on a graphic user interface.

In some embodiments, the process may further include performing a control action with respect to fabrication of the semiconductor structure based on the output results. The output results may include computer-readable feedback.

In some embodiments, the control action may include at least one of maintaining fabrication of the semiconductor structure with existing settings, changing a setting for the fabrication of the semiconductor structure, and discarding the semiconductor structure.

The foregoing description of the specific embodiments will so reveal the general nature of the present disclosure that others can, by applying knowledge within the skill of the art, readily modify and/or adapt for various applications of such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

Embodiments of the present disclosure have been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Summary and Abstract sections may set forth one or more but not all exemplary embodiments of the present disclosure as contemplated by the inventor(s), and thus, are not intended to limit the present disclosure and the appended claims in any way.

The breadth and scope of the present disclosure should not be limited by any of the above-described exemplary embodiments, but should be defined only in accordance with the following claims and their equivalents.

What is claimed is:

1. A method for thickness detection in a semiconductor structure, comprising:

detecting, by at least one processor, a tilt of a stack of layers of the semiconductor structure in an image, the image showing that the stack of layers extends, with the tilt, along a lateral direction;

performing, by the at least one processor, rough boundary line detection on the layers of the stack in the image based on the tilt of the stack of layers;

performing, by the at least one processor, fine thickness detection on the layers of the stack in the image based on the rough boundary line detection, wherein the rough boundary line detection detects boundaries of the layers of the stack with a first precision, and the fine thickness detection detects thickness of the layers of the stack with a second precision greater than the first precision; and providing, by the at least one processor, output results of the fine thickness detection.

2. The method of claim 1, wherein the image comprises a greyscale image.

3. The method of claim 1, wherein the stack comprises alternating layers of a first material and a second material different from the first material.

4. The method of claim 3, wherein the alternating layers are lateral layers stacked in a vertical direction.

5. The method of claim 1, wherein the detecting the tilt comprises identifying a tilt that minimizes a cost function with respect to intensity variation for representative lines across the image in the lateral direction.

6. The method of claim 1, wherein the performing the rough boundary line detection comprises determining midpoints in average intensity in a vertical direction.

7. The method of claim 6, wherein the determining midpoints comprises performing a quadratic fit on the average intensities.

8. The method of claim 1, wherein the performing fine thickness detection comprises detecting an intensity separator near a given rough boundary line detected by the rough boundary line detection.

9. The method of claim 8, wherein the performing fine thickness detection further comprises validating the intensity separator.

10. The method of claim 9, wherein the validating comprises determining a degree to which the intensity separator separates pixels of different intensities.

11. The method of claim 1, wherein the output results comprise a visual display presented on a graphic user interface.

12. The method of claim 1, further comprising:
performing, by the at least one processor, a control action with respect to fabrication of the semiconductor structure based on the output results, wherein the output results comprise computer-readable feedback.

13. The method of claim 12, wherein the control action comprises one of maintaining fabrication of the semiconductor structure with existing settings, changing setting for the fabrication of the semiconductor structure, and discarding the semiconductor structure.

14. A system for thickness detection in a semiconductor structure, comprising:
at least one processor; and
at least one memory storing computer program code, wherein the at least one processor is configured to, with the at least one memory and the computer program code, cause the system at least to:
detect a tilt of a stack of layers of the semiconductor structure in an image, the image showing that the stack of layers extends, with the tilt, along a lateral direction;
perform rough boundary line detection on the layers of the stack in the image based on the tilt of the stack of layers;
perform fine thickness detection on the layers of the stack in the image based on the rough boundary line detection, wherein the rough boundary line detection detects boundaries of the layers of the stack with a first precision, and the fine thickness detection detects thickness of the layers of the stack with a second precision greater than the first precision; and
provide output results of the fine thickness detection.

15. The system of claim 14, wherein the at least one processor is configured to cause the system at least to detect the tilt by identifying a tilt that minimizes a cost function with respect to intensity variation for representative lines across the image in the lateral direction.

16. The system of claim 14, wherein the at least one processor is configured to cause the system at least to perform the rough boundary line detection by determining mid-points in average intensity in a vertical direction.

17. The system of claim 14, wherein the at least one processor is configured to cause the system at least to perform fine thickness detection by detecting an intensity separator near a given rough boundary line detected by the rough boundary line detection.

18. The system of claim 17, wherein the at least one processor is configured to cause the system at least to validate the intensity separator.

19. The system of claim 18, wherein the at least one processor is configured to cause the system at least to validate the intensity separator by determining a degree to which the intensity separator separates pixels of different intensities.

20. A non-transitory computer-readable medium encoded with instructions that, when executed in hardware, cause a device to perform a process for thickness detection in a semiconductor structure, the process comprising:
detecting a tilt of a stack of layers of the semiconductor structure in an image, the image showing that the stack of layers extends, with the tilt, along a lateral direction;
performing rough boundary line detection on the layers of the stack in the image based on the tilt of the stack of layers;
performing fine thickness detection on the layers of the stack in the image based on the rough boundary line detection, wherein the rough boundary line detection detects boundaries of the layers of the stack with a first precision, and the fine thickness detection detects thickness of the layers of the stack with a second precision greater than the first precision; and
providing output results of the fine thickness detection.

* * * * *